(12) United States Patent
Li et al.

(10) Patent No.: US 11,508,761 B2
(45) Date of Patent: Nov. 22, 2022

(54) INVERTER CIRCUIT STRUCTURE, GATE DRIVING CIRCUIT AND DISPLAY PANEL

(71) Applicant: Xiamen Tianma Micro-Electronics Co., Ltd., Xiamen (CN)

(72) Inventors: Jieliang Li, Xiamen (CN); Yuping Xu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 92 days.

(21) Appl. No.: 16/726,260

(22) Filed: Dec. 24, 2019

(65) Prior Publication Data
US 2020/0135774 A1    Apr. 30, 2020

(30) Foreign Application Priority Data

Apr. 29, 2019 (CN) .......................... 201910357148.3

(51) Int. Cl.
*H01L 27/12*  (2006.01)
*H01L 29/417* (2006.01)
(Continued)

(52) U.S. Cl.
CPC ........ *H01L 27/1251* (2013.01); *H01L 27/124* (2013.01); *H01L 27/1229* (2013.01);
(Continued)

(58) Field of Classification Search
CPC ............. H01L 27/1251; H01L 27/1229; H01L 27/124; H01L 29/41733; H01L 29/4238;
(Continued)

(56) References Cited

U.S. PATENT DOCUMENTS

| 2007/0235815 A1* | 10/2007 | Kim ...................... H01L 27/092 257/369 |
| 2009/0014799 A1* | 1/2009 | Isobe .................. H01L 27/1203 257/351 |

(Continued)

FOREIGN PATENT DOCUMENTS

| CN | 202758893 U | 2/2013 |
| CN | 105612620 A | 5/2016 |
| CN | 109494229 A1 | 3/2019 |

OTHER PUBLICATIONS

Shengdong Zhang, A Stacked CMOS Technology on SOI Substrate, IEEE Electron Dev. Let., vol. 25, No. 9, pp. 661-663, Sep. 2004 (Zhang). (Year: 2004).*

*Primary Examiner* — S M Sohel Imtiaz
(74) *Attorney, Agent, or Firm* — Kilpatrick Townsend & Stockton, LLP (57) ABSTRACT

Provided are an inverter circuit structure, a gate driving circuit and a display panel. The inverter circuit structure includes a PMOS transistor and an NMOS transistor, and further includes a first active layer, a gate layer, a second active layer, a first insulating layer between the gate layer and the first active layer, and a second insulating layer between the gate layer and the second active layer. An orthographic projection of the gate on the first active layer is a first region, and a portion of the first active layer in the first region has substantially a same thickness. An orthographic projection of the gate on the second active layer is a second region, and a portion of the second active layer in the second region has substantially a same thickness.

16 Claims, 10 Drawing Sheets

(51) Int. Cl.
*H01L 29/423* (2006.01)
*H01L 29/786* (2006.01)
*H03K 3/037* (2006.01)
*G09G 3/3266* (2016.01)
*G09G 3/36* (2006.01)

(52) U.S. Cl.
CPC .... *H01L 29/41733* (2013.01); *H01L 29/4238* (2013.01); *H01L 29/42384* (2013.01); *H01L 29/7869* (2013.01); *H01L 29/78675* (2013.01); *H03K 3/037* (2013.01); *G09G 3/3266* (2013.01); *G09G 3/3677* (2013.01); *G09G 2300/0426* (2013.01); *G09G 2300/08* (2013.01)

(58) Field of Classification Search
CPC ......... H01L 29/42384; H01L 29/78675; H01L 29/7869; H01L 29/78678; H01L 27/092; H01L 27/1225; H01L 27/0688
See application file for complete search history.

(56) References Cited

U.S. PATENT DOCUMENTS

| | | | |
|---|---|---|---|
| 2010/0079169 A1* | 4/2010 | Kim | H01L 27/0883 326/120 |
| 2010/0148825 A1* | 6/2010 | Park | H01L 29/41733 326/121 |
| 2015/0171809 A1 | 6/2015 | Song | |
| 2015/0348997 A1* | 12/2015 | Sasagawa | H01L 27/1251 257/43 |
| 2016/0240565 A1* | 8/2016 | Kim | G09G 3/3233 |
| 2019/0131457 A1* | 5/2019 | Wang | H01L 27/1225 |
| 2020/0176576 A1* | 6/2020 | Lee | H01L 27/127 |
| 2020/0356201 A1* | 11/2020 | Shen | G06F 3/0412 |

* cited by examiner

INVERTER CIRCUIT STRUCTURE, GATE DRIVING CIRCUIT AND DISPLAY PANEL

CROSS-REFERENCES TO RELATED APPLICATIONS

This application claims priority to a Chinese patent application No. CN 201910357148.3 filed at CNIPA on Apr. 29, 2019, disclosure of which is incorporated herein by reference in its entirety.

TECHNICAL FIELD

The present disclosure relates to the field of display technologies and, in particular, to an inverter circuit structure, a gate driving circuit and a display panel.

BACKGROUND

Figure 1:
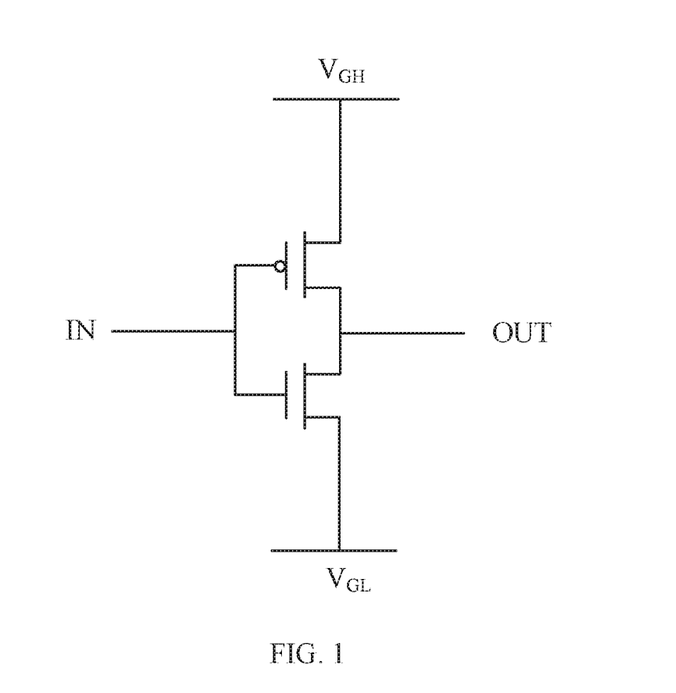
FIG. 1 is a diagram of an equivalent circuit of a CMOS inverter.

A complementary metal oxide semiconductor (CMOS) inverter includes a P-channel metal oxide semiconductor (PMOS) transistor and an N-channel metal oxide semiconductor (NMOS) transistor connected in series. FIG. 1 is a diagram of an equivalent circuit of a CMOS inverter. The CMOS inverter includes a control input terminal IN, an output terminal OUT, a first voltage input terminal $V_{GH}$ and a second voltage input terminal $V_{GL}$, where a gate of the PMOS transistor and a gate of the NMOS transistor are both electrically connected to the control input terminal IN, and a drain of the PMOS transistor and a drain of the NMOS transistor are both electrically connected to the output terminal OUT. A turn-on voltage $V_{GS(th)P}$ of the PMOS transistor is smaller than 0, a turn-on voltage $V_{GS(th)N}$ of the NMOS transistor is larger than 0, and it is generally required that $V_{GH}>|V_{GS(th)P}|+V_{GS(th)N}$ in order to ensure normal operations. If the input terminal IN has a low-level voltage (e.g., −7V), the PMOS transistor is turned on, the NMOS transistor is turned off, and an output voltage is close to $V_{GH}$. If the input terminal IN has a high-level voltage (e.g., $V_{GH}$), the NMOS transistor is turned on, the PMOS transistor is turned off, and the output voltage is close to $V_{GL}$.

Figure 2:
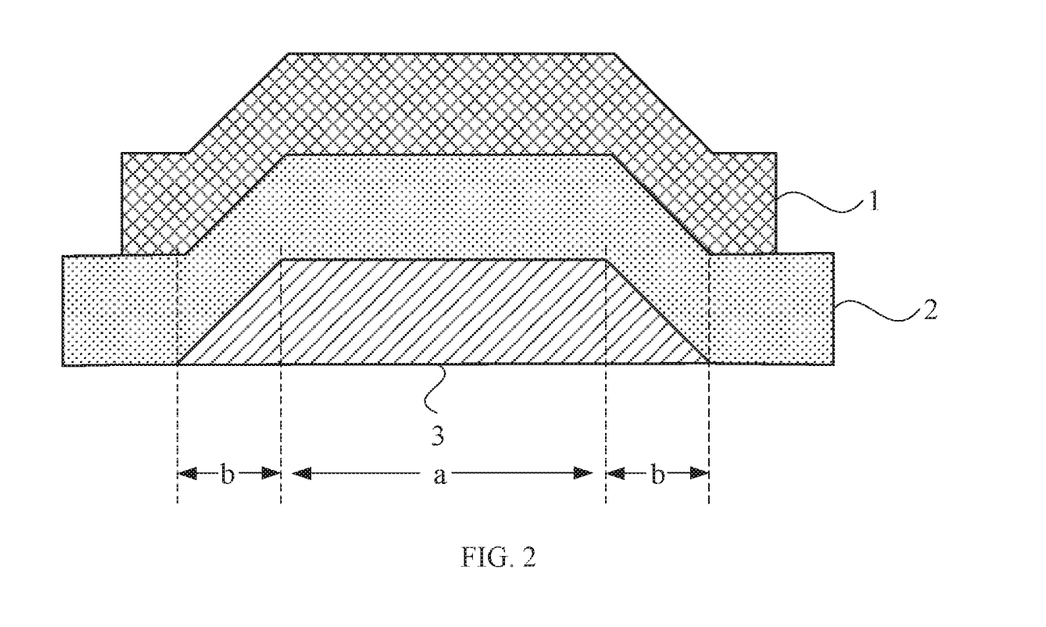
FIG. 2 is a schematic diagram of a partial structure of a PMOS/NMOS transistor in a CMOS inverter in the related art.
Figure 3:
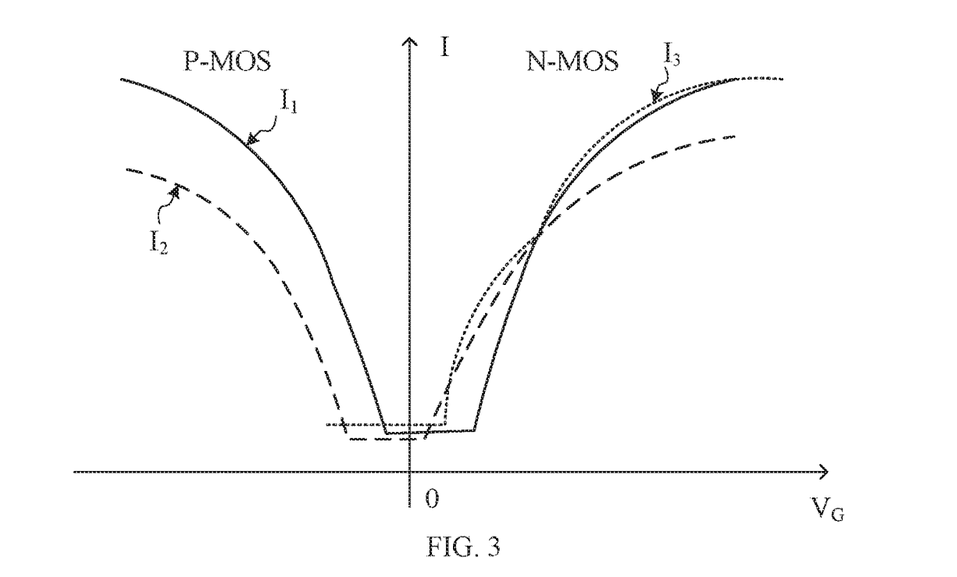
FIG. 3 is a schematic diagram of voltage-current (V-I) characteristics of a CMOS inverter in the related art.

In the related art, the PMOS transistor and the NMOS transistor are generally in planar structures, and the area occupied by the PMOS transistor and the NMOS transistor is large. Each of the PMOS transistor and the NMOS transistor generally has a linear gate. FIG. 2 is a schematic diagram of a partial structure of a PMOS/NMOS transistor in a CMOS inverter in the related art. FIG. 3 is a schematic diagram of voltage-current (V-I) characteristics of a CMOS inverter in the related art. A gate 1, an insulating layer 2 and an active layer 3 are shown in FIG. 2. The active layer 3 includes a main channel region a and sub-channel regions b located on slopes on two sides of the main channel region a. A curve $I_1$ in FIG. 3 is a V-I curve of the main channel region a, and a curve I2 is a V-I curve of the sub-channel region b. When a same voltage is applied to the gate 1, the current in the main channel region a is different from the current in the sub-channel region b, causing that the V-I curve is not smooth, i.e., a hump phenomenon occurs in $I_3$.

SUMMARY

Embodiments of the present disclosure provide an inverter circuit structure, a gate driving circuit and a display panel.

In a first aspect, an embodiment of the present disclosure provides an inverter circuit structure which at least includes a PMOS transistor and an NMOS transistor. The inverter circuit structure further includes a first active layer, a gate layer, a second active layer, a first insulating layer, and a second insulating layer. The first active layer, the gate layer and the second active layer are sequentially stacked. The first insulating layer is located between the gate layer and the first active layer. The second insulating layer is located between the gate layer and the second active layer.

The gate layer includes a patterned gate, which is electrically connected to a control input terminal.

An orthographic projection of the gate on the first active layer is a first region, and a portion of the first active layer in the first region has substantially a same thickness. An orthographic projection of the gate on the second active layer is a second region, and a portion of the second active layer in the second region has substantially a same thickness.

A first electrode of the PMOS transistor is electrically connected to a first voltage input terminal, and a second electrode of the PMOS transistor is electrically connected to an output terminal. A first electrode of the NMOS transistor is electrically connected to a second voltage input terminal, and a second electrode of the NMOS transistor is electrically connected to the output terminal.

In a second aspect, an embodiment of the present disclosure further provides a gate driving circuit which includes at least one inverter circuit structure. The inverter circuit structure includes a PMOS transistor and an NMOS transistor. The inverter circuit structure further includes a first active layer, a gate layer, a second active layer, a first insulating layer, and a second insulating layer. The first active layer, the gate layer and the second active layer are sequentially stacked. The first insulating layer is between the gate layer and the first active layer. The second insulating layer is between the gate layer and the second active layer.

In a third aspect, an embodiment of the present disclosure further provides a display panel which includes a gate driving circuit. The gate driving circuit includes at least one inverter circuit structure. The inverter circuit structure includes a PMOS transistor and an NMOS transistor. The inverter circuit structure further includes a first active layer, a gate layer, a second active layer, a first insulating layer, and a second insulating layer. The first active layer, the gate layer and the second active layer are sequentially stacked. The first insulating layer is between the gate layer and the first active layer. The second insulating layer is between the gate layer and the second active layer.

DETAILED DESCRIPTION

Hereinafter the present disclosure will be further described in detail with reference to the drawings and embodiments. It is to be understood that the embodiments set forth below are intended to illustrate the present disclosure and not to limit the present disclosure. Additionally, for ease of description, only part, not all, of the structures related to the present disclosure are illustrated in the drawings.

Terms used in the embodiments of the present disclosure are only used to describe specific embodiments and not intended to limit the present disclosure. It is to be noted that spatially related terms, including "on", "below", "left" and "right" used in the embodiments of the present disclosure, are described from the perspective of the drawings, and are not to be construed as a limitation to the present disclosure. In addition, in the context, it will be understood that when a component is formed "on" or "below" another component, it may not only be directly formed "on" or "below" another component, and may also be indirectly formed "on" or "below" another component via an intermediate component. Terms "first", "second" and the like are only used for description and to distinguish between different components rather than indicate any order, quantity, or importance. For those skilled in the art, the preceding terms can be construed according to specific circumstances in the present disclosure.

An embodiment of the present disclosure provides an inverter circuit structure. The inverter circuit at least includes a PMOS transistor and an NMOS transistor. The inverter circuit structure includes a first active layer, a gate layer, a second active layer, a first insulating layer, and a second insulating layer. The first active layer, the gate layer and the first insulating layer are sequentially stacked. The first insulating layer is between the gate layer and the first active layer, and the second insulating layer is between the gate layer and the second active layer. The gate layer includes a patterned gate, which is electrically connected to a control input terminal. An orthographic projection of the gate on the first active layer is a first region, and the first active layer has substantially a same thickness in the first region, which means that the first active layer is designed to have a same thickness in the first region, but the actually manufactured first active layer may not be exactly uniform in thickness due to process variation. An orthographic projection of the gate on the second active layer is a second region, and the second active layer has substantially a same thickness in the second region, which means that the second active layer is designed to have a same thickness in the second region, but the actually manufactured second active layer may not be exactly uniform in thickness due to process variation. A first electrode of the PMOS transistor is electrically connected to a first voltage input terminal, and a first electrode of the NMOS transistor is electrically connected to a second voltage input terminal. A second electrode of the PMOS transistor and a second electrode of the NMOS transistor are both electrically connected to an output terminal.

The first active layer, the gate layer and the second active layer are stacked in sequence to form a three-dimensional inverter circuit structure, which can effectively reduce an area occupied by the inverter circuit compared with a planar inverter circuit structure. A drive circuit of a display panel is also disclosed. The a drive circuit includes the above inverter circuit structure, and therefore a frame of the is reduced. The patterned gate structure is helpful to increase a width-to-length ratio of a channel of the transistor and improve performance of the transistor. The first active layer has substantially a same thickness in the first region, and the second active layer has substantially a same thickness in the second region, so that a sub-channel in the channel region of the transistor is eliminated, thereby avoiding an unsmooth V-I curve and eliminating the hump phenomenon.

Figure 4:
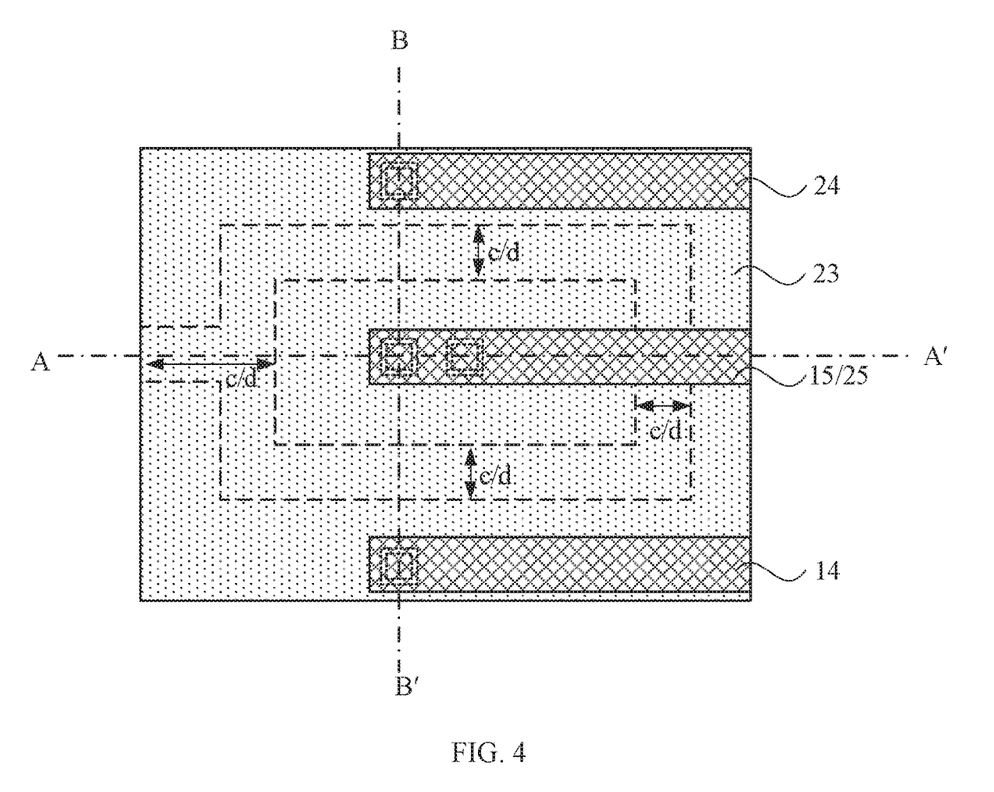
FIG. 4 is a schematic diagram of an inverter circuit structure according to an embodiment of the present disclosure.
Figure 5:
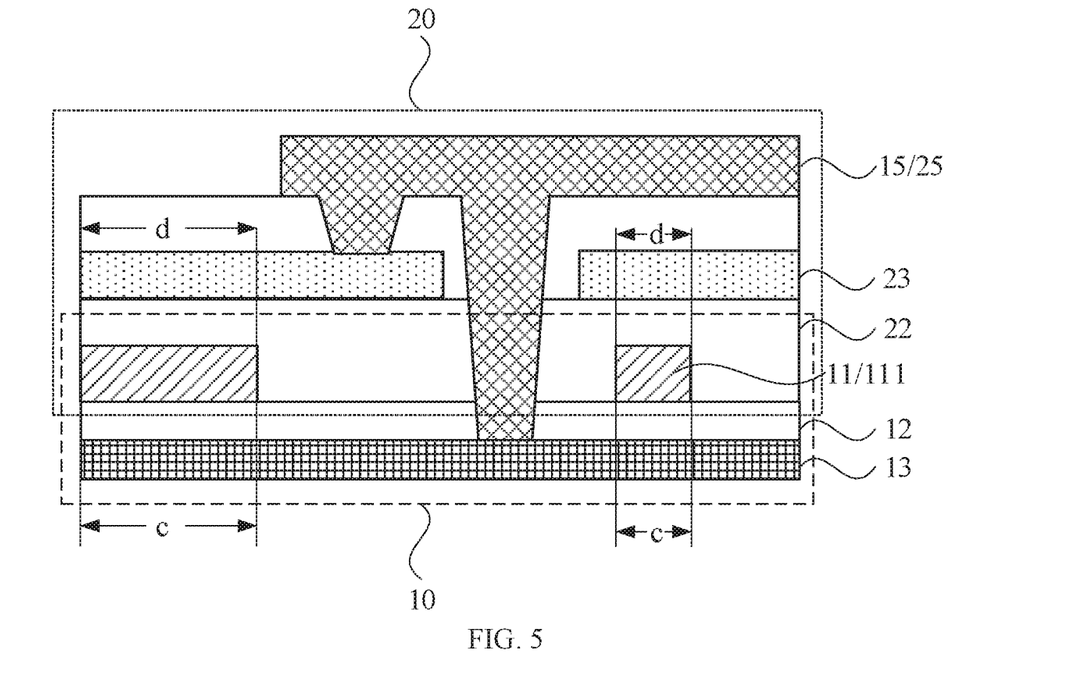
FIG. 5 is a sectional view taken along a line A-A' in FIG. 4.
Figure 6:
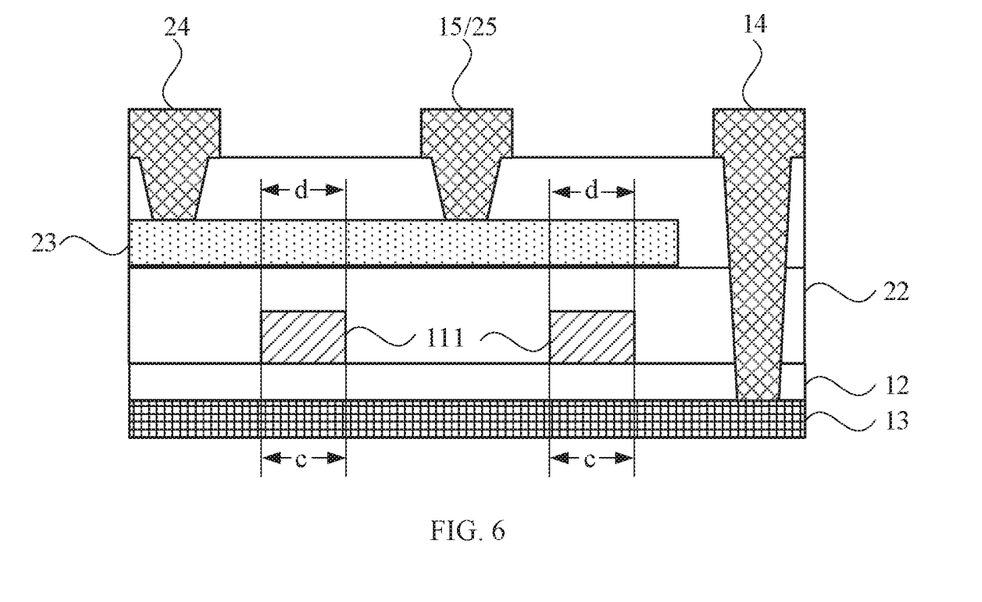
FIG. 6 is a sectional view taken along a line B-B' in FIG. 4.

FIG. 4 is a schematic diagram of an exemplary inverter circuit structure according to an embodiment of the present disclosure. FIG. 5 is a sectional view taken along a line A-A' in FIG. 4. FIG. 6 is a sectional view taken along a line B-B' in FIG. 4. The inverter circuit in the present embodiment includes a PMOS transistor 10 and an NMOS transistor 20. As shown in FIGS. 4 to 6, the inverter circuit includes a first active layer 13, a gate layer 11 and a second active layer 23 which are sequentially stacked, and further includes a first insulating layer 12 between the gate layer 11 and the first active layer 13 and a second insulating layer 22 between the gate layer 11 and the second active layer 23. Both the first insulating layer 12 and the second insulating layer 22 may be made of silicon oxide ($SiO_x$). The gate layer 11 includes patterned gates 111, which are electrically connected to the control input terminal (not shown in FIG. 4). The orthographic projection of the gate 111 on the first active layer 13 is the first region c, and the first active layer 13 has substantially a same thickness in the first region c. The orthographic projection of the gate 111 on the second active layer 23 is the second region d, and the second active layer 23 has substantially a same thickness in the second region d. The first electrode 14 of the PMOS transistor 10 is electrically connected to the first voltage input terminal (not shown in FIG. 4), and the second electrode 15 of the PMOS transistor 10 is electrically connected to the output terminal (not shown in FIG. 4). The first electrode 24 of the NMOS transistor 20 is electrically connected to the second voltage input terminal (not shown in FIG. 4) and the second electrode 25 of the NMOS transistor 20 is electrically connected to the output terminal (not shown in FIG. 4).

In the present embodiment, the PMOS transistor 10 and the NMOS transistor 20 share the gate 111. Exemplarily, the PMOS transistor 10 corresponds to the first active layer 13 and the NMOS transistor 20 corresponds to the second active layer 23, and the PMOS transistor 10 is disposed below the NMOS transistor 20. In other embodiments, the PMOS transistor 10 may also be disposed above the NMOS transistor 20. In the equivalent circuit diagram shown in FIG. 1, the gate 111 is electrically connected to the control input terminal IN, the first electrode 14 of the PMOS transistor 10 is a source and is electrically connected to the first voltage input terminal $V_{GH}$, the second electrode 15 of the PMOS transistor 10 is a drain and is electrically connected to the output terminal OUT, the first electrode 24 of the NMOS transistor 20 is a source and is electrically connected to the second voltage input terminal $V_{GL}$, and the second electrode 25 of the NMOS transistor 20 is a drain and is electrically connected to the output terminal OUT. The gate 111 has a patterned structure. For example, as shown in FIG. 4, the gate 111 is a ring-shaped pattern with a rectangular edge, which may effectively increase a width-to-length ratio of a transistor channel.

In the technical solution in the embodiment of the present disclosure, the first active layer, the gate layer and the second active layer are successively stacked to form a three-dimensional inverter circuit structure, which can effectively reduce the area occupied by the inverter circuit compared with a planar inverter circuit structure. A frame of display panel, a driving circuit of which includes the three-dimensional inverter circuit structure, can be effectively reduced. In the planar inverter circuit structure, gates of two transistors receive the same input signal, and therefore a connection line is needed to connect the gates of the two transistors and the connection line is further connected to the input terminal. In addition, output signals of the two transistors need to be electrically connected to a same output terminal through an additional signal line. However, in the three-dimensional inverter circuit structure provided by the embodiment of the present disclosure, two thin film transistors (TFTs) share the gate layer, gate signal terminals of the two TFTs are connected together, and output terminals of the two TFTs share one electrode, thereby simplifying a signal line layout of the inverter circuit structure. Furthermore, the gate layer is disposed between two active layers to form the three-dimensional circuit structure and the gate is in a patterned structure, for example, a gate structure including a plurality of strip-shaped sub-gates, thereby reducing the occupied area under a same channel width-to-length ratio. That is, the three-dimensional inverter circuit structure has a larger channel width-to-length ratio than the planar inverter circuit structure occupying a same area as the three-dimensional inverter circuit structure, which helps to improve the performance of the transistor. In the embodiment of the present disclosure, each of the two active layers is designed as a whole plane, and the gate is disposed between the two active layers to form the three-dimensional inverter circuit structure. Each active layer of the three-dimensional inverter circuit structure may have a larger area than the active layer in the planar inverter circuit structure. In addition, with the patterned gate, the active layer corresponding to the gate has substantially a same thickness, so that a slope region between the active layer and the gate may be avoided, and a sub-channel may be eliminated in the channel region of the transistor, thereby avoiding an unsmooth V-I curve and eliminating a hump phenomenon.

On the basis of the above embodiments, in one or more embodiments, the patterned gate includes at least two strip-shaped sub-gates, and the at least two strip-shaped sub-gates are electrically connected through at least one common terminal.

In one or more embodiments, the strip-shaped sub-gates form a ring-shaped pattern.

With continued reference to FIG. 4, with the strip-shaped sub-gates being arranged in the ring-shaped structure, the channel may also be disposed in an extending direction of line B-B', further increasing the width-to-length ratio of the channel region. Ends of the strip-shaped sub-gates facing away from the control input terminal are electrically connected, ensuring potential equalization of the gate, making an electric field of the channel region uniform, and improving device performance.

In one or more embodiments, an outer edge of the ring-shaped pattern is quadrilateral.

A shape of the outer edge of the patterned gate may be a square, a rectangle, a parallelogram or a trapezoid, and may be configured according to practical conditions in a specific implementation. FIG. 4 schematically shows that the ring-shaped pattern is the rectangle.

Figure 7:
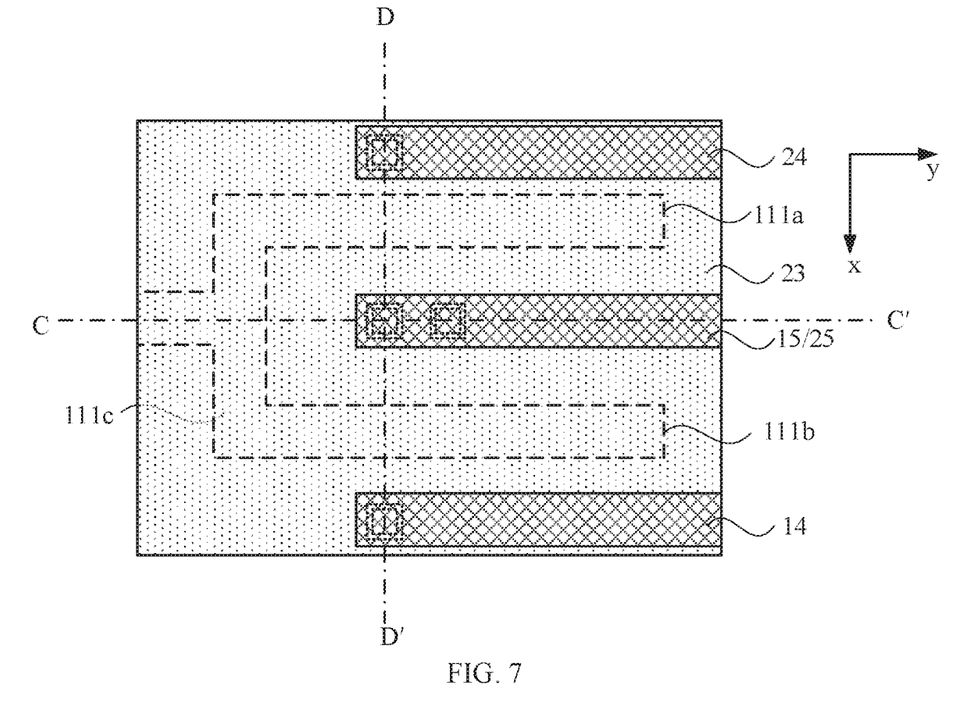
FIG. 7 is a schematic diagram of another inverter circuit structure according to an embodiment of the present disclosure.

FIG. 7 is a schematic diagram of another exemplary inverter circuit structure according to an embodiment of the present disclosure. Referring to FIG. 7, the patterned gate 111 includes a strip-shaped sub-gate 111a and a strip-shaped sub-gate 111b, and the two strip-shaped sub-gates are electrically connected through a common terminal 111c.

A shape of the gate in FIG. 7 is only illustrative, and the shape of the strip-shaped sub-gate and the number of strip-shaped sub-gates may be designed according to practical requirements in a specific implementation. For example, the shape of the strip-shaped sub-gate may be polyline, grid, or the like, which is not limited in the embodiments of the present disclosure. With the strip-shaped sub-gates of the gate, the channel width-to-length ratio may be increased under a same device occupation area, and the performance of the transistor may be improved.

In one or more embodiments, in a first direction, the second electrode of the PMOS transistor and the second electrode of the NMOS transistor are disposed between the two strip-shaped sub-gates, where the first direction is perpendicular to an extending direction of the strip-shaped sub-gates.

Figure 8:
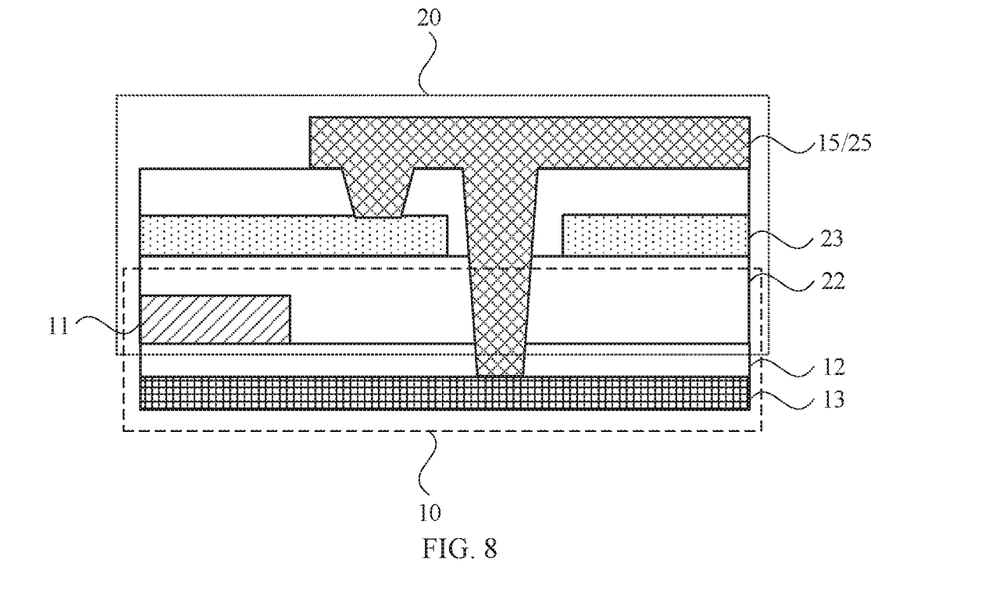
FIG. 8 is a sectional view taken along a line C-C' in FIG. 7.
Figure 9:
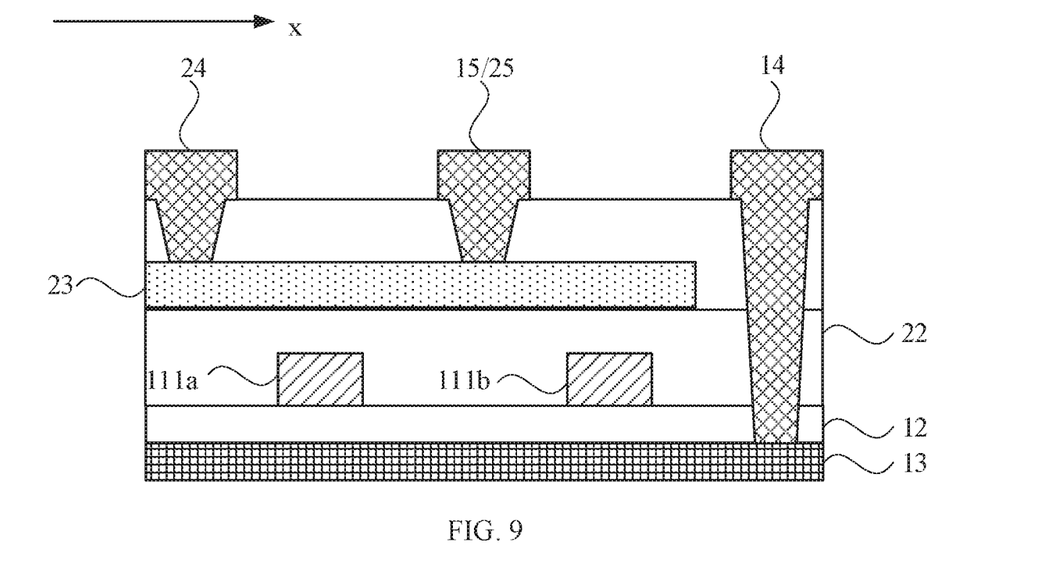
FIG. 9 is a sectional view taken along a line D-D' in FIG. 7.

FIG. 8 is a sectional view of an exemplary inverter circuit structure taken along a line C-C' in FIG. 7. FIG. 9 is a sectional view of the exemplary inverter circuit structure taken along a line D-D' in FIG. 7. Referring to FIGS. 7 to 9, in the first direction x, the second electrode 15 of the PMOS transistor 10 and the second electrode 25 of the NMOS transistor 20 are disposed between the strip-shaped sub-gate 111a and the strip-shaped sub-gate 111b, where the first direction x is perpendicular to the extending direction y of the strip-shaped sub-gates 111a/111b.

Figure 10:
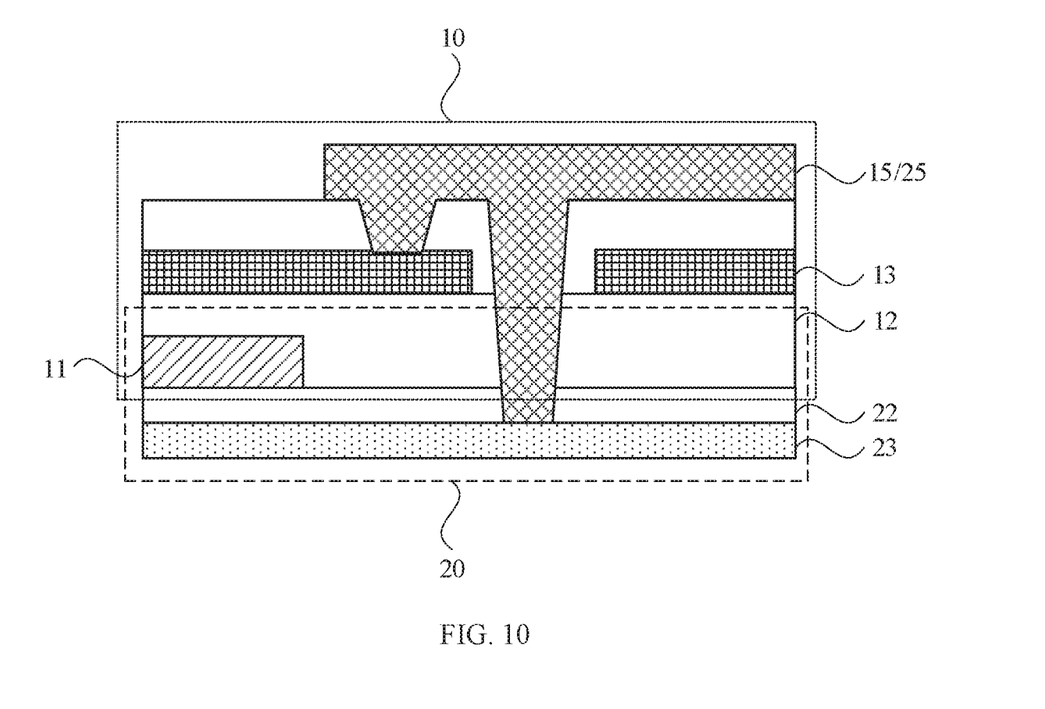
FIG. 10 is another sectional view taken along a line C-C' in FIG. 7.
Figure 11:
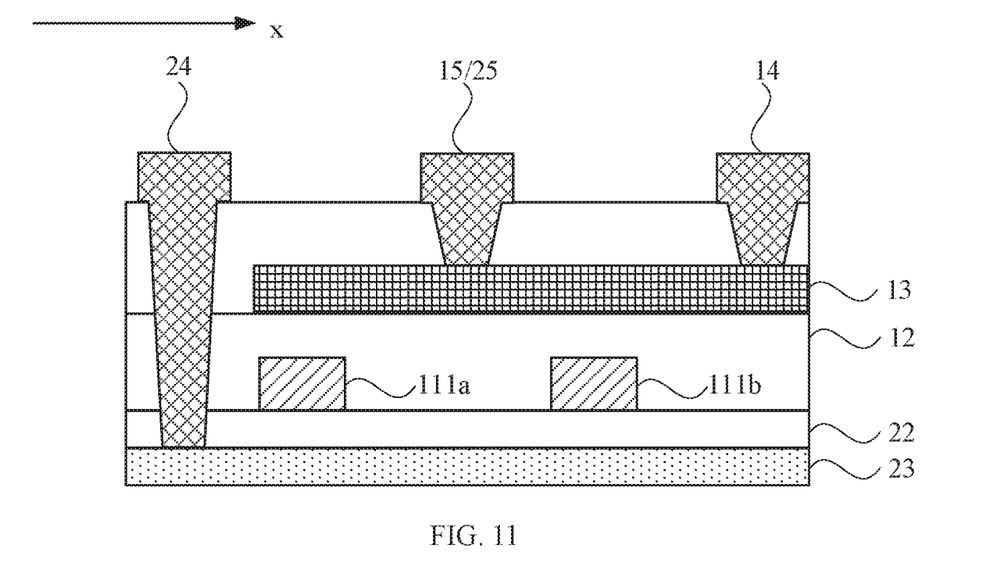
FIG. 11 is another sectional view taken along a line D-D' in FIG. 7.

In one or more embodiments, as shown in FIGS. 8 and 9, the second electrode 15 of the PMOS transistor 10 is reused as the second electrode 25 of the NMOS transistor 20, the second electrode 25 of the NMOS transistor 20 is electrically connected to the second active layer 23, and the second electrode 25 of the NMOS transistor 20 is further electrically connected to the first active layer 13 through a via penetrating through the second active layer 23, the second insulating layer 22 and the first insulating layer 12 in sequence. FIG. 10 is a sectional view of another inverter circuit structure taken along the line C-C' in FIG. 7. FIG. 11 is a sectional view of the inverter circuit structure taken along the line D-D' in FIG. 7. In the embodiment shown in FIG. 11 and FIG. 12, the second electrode 25 of the NMOS transistor 20 is reused as the second electrode 15 of the PMOS transistor 10, and the second electrode 15 of the PMOS transistor 10 is electrically connected to the first active layer 13, and the second electrode 15 of the PMOS transistor 10 is further electrically connected to the second active layer 23 through a via penetrating through the first active layer 13, the first insulating layer 12 and the second insulating layer 22 in sequence. The second electrode 15 of the PMOS transistor 10 is reused as the second electrode 25 of the NMOS transistor 20, so that two electrodes may be formed in one process flow, simplifying the inverter circuit structure and decreasing a process difficulty and manufacturing costs.

A difference between the inverter circuit structure in FIG. 8 and the inverter circuit structure in FIG. 10 is that the PMOS transistor 10 and the NMOS transistor 20 are stacked in opposite manners, and the stacking manner may be selected according to practical process conditions in a specific implementation. The stacking manner of the PMOS transistor 10 and the NMOS transistor 20 is not limited in the embodiments of the present disclosure.

In one or more embodiments, the first active layer includes a polysilicon active layer, and the second active layer includes an oxide active layer.

In the embodiments of the present disclosure, the first active layer may be a low temperature poly-silicon (LTPS) layer, and has a highly doped source region and a highly doped drain region. When the transistor is turned on, a P-type conductive channel is formed between the source region and the drain region. The first active layer may serve as the active layer of the PMOS transistor. The second active layer is the active layer of the NMOS transistor and may be made of oxide or sulfur oxide of at least one of zinc (Zn), indium (In), tin (Sn), gallium (Ga) or aluminum (Al). Since the NMOS transistor in the present embodiment employs oxide active layer, the NMOS transistor does not need to be highly doped with N-type dopants, simplifying the manufacturing process and reducing the manufacturing costs.

Figure 12:
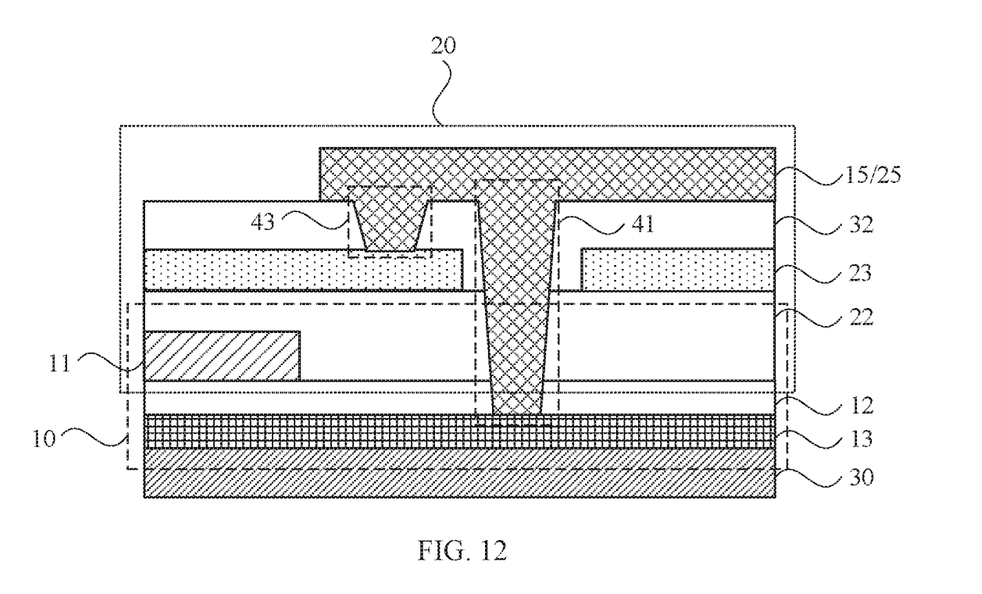
FIG. 12 is another sectional view taken along a line C-C' in FIG. 7.
Figure 13:
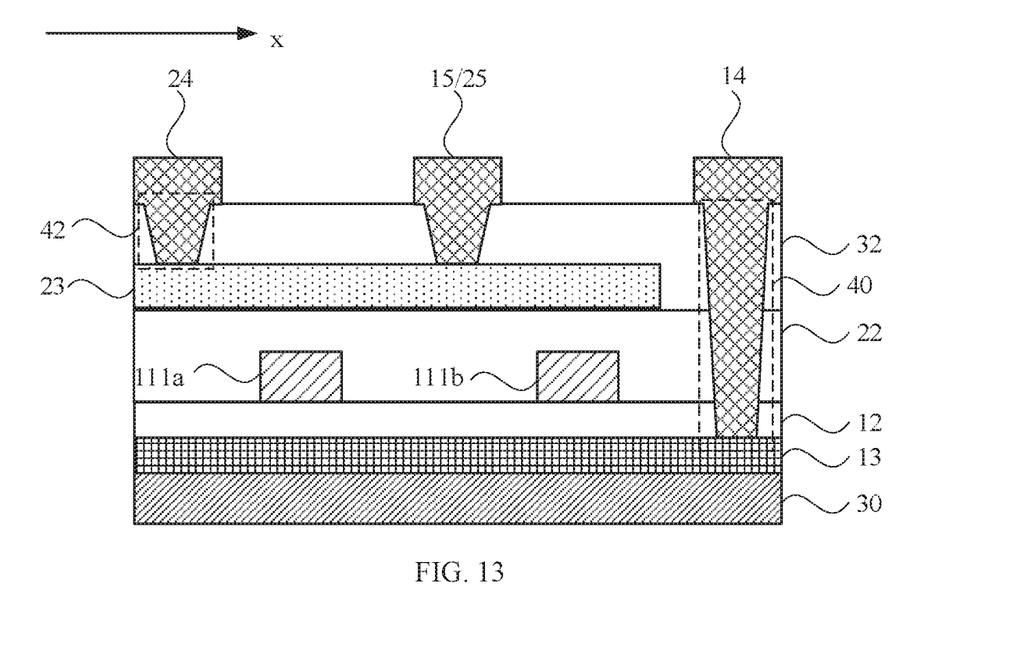
FIG. 13 is another sectional view taken along a line D-D' in FIG. 7.

FIG. 12 is another sectional view taken along the line C-C' in FIG. 7, and FIG. 13 is another sectional view taken along the line D-D' in FIG. 7. Referring to FIGS. 12 and 13, in one embodiment of the present disclosure, the inverter circuit structure further includes a substrate 30 and a third insulating layer 32. The first active layer 13 is disposed on a side of the gate layer 11 facing towards the substrate 30. The first electrode 14 of the PMOS transistor 10, the second electrode 15 of the PMOS transistor 10, the first electrode 24 of the NMOS transistor 20 and the second electrode 25 of the NMOS transistor 20 are all disposed on a side of the third insulating layer 32 facing away from the second active layer 23. The first electrode 14 of the PMOS transistor 10 is electrically connected to the first active layer 13 through a first via 40 penetrating through the third insulating layer 32, the second insulating layer 22 and the first insulating layer 12 in sequence. The second electrode 15 of the PMOS transistor 10 is electrically connected to the first active layer 13 through a second via 41 penetrating through the third insulating layer 32, the second insulating layer 22 and the first insulating layer 12 in sequence. The first electrode 24 of the NMOS transistor 20 is electrically connected to the second active layer 23 through a third via 42 penetrating through the third insulating layer 32. The second electrode 25 of the NMOS transistor 20 is electrically connected to the second active layer 23 through a fourth via 43 penetrating through the third insulating layer 32. The second active layer 23 is a patterned structure, and a region where the first via 40 is located and a region where the second via 41 is located are exposed.

In the inverter circuit structure shown in FIGS. 12 and 13, the PMOS transistor 10 is disposed below the NMOS transistor 20, and the third insulating layer 32 may be made of the same material as the first insulating layer 12 and/or the second insulating layer 22. For example, the third insulating layer 32 may be made of silicon oxide (SiO$_x$). The first via 40 and the second via 41 may be formed, after the third insulating layer 32 is formed, by penetrating through the three insulating layers in sequence. A patterned structure for exposing the regions where the first via 40 and the second via 41 are located is reserved in the second active layer 23, and then the first via 40 and the second via 41 are filled with metal materials of the corresponding electrodes to form the electrodes. The third via 42 and the fourth via 43 may be formed, after the third insulating layer 32 is formed, by penetrating through the third insulating layer 32.

Figure 14:
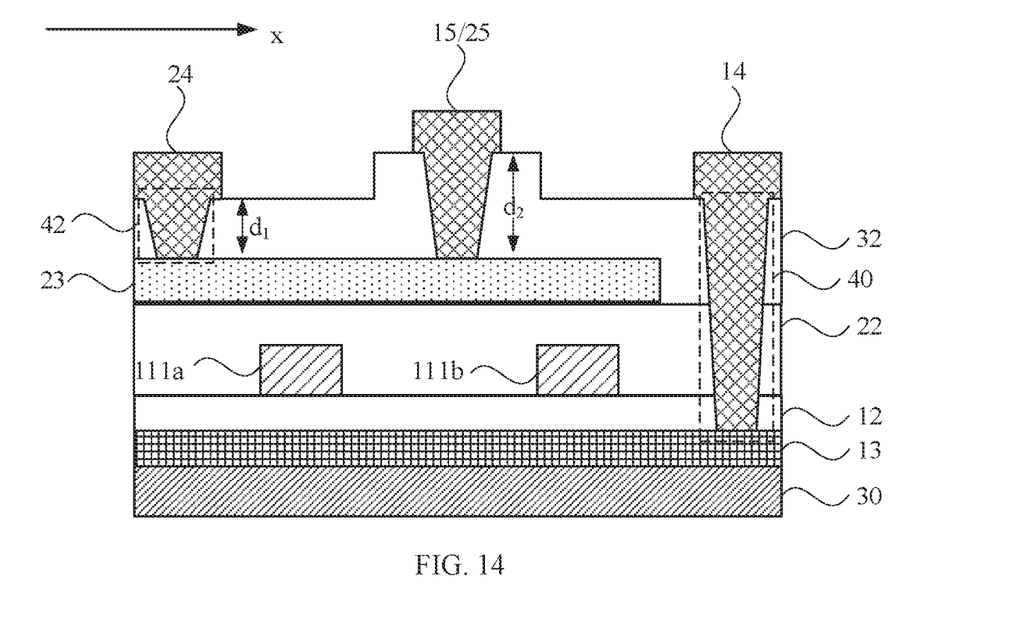
FIG. 14 is another sectional view taken along a line D-D' in FIG. 7.

FIG. 14 is another sectional view taken along the line D-D' in FIG. 7. Referring to FIG. 14, in one embodiment of the present disclosure, the first electrode 14 of the PMOS transistor 10 and the first electrode 24 of the NMOS transistor 20 are arranged at a same layer, and the second electrode 15 of the PMOS 10 transistor and the second electrode 25 of the NMOS transistor 20 are arranged at a same layer. A distance between the first electrode 24 of the NMOS transistor and the second active layer 23 is different from a distance between the second electrode 25 of the NMOS transistor and the second active layer 23.

FIG. 14 exemplarily shows that the distance $d_1$ between the first electrode 24 of the NMOS transistor 20 and the second active layer 23 is smaller than the distance $d_2$ between the second electrode 25 of the NMOS transistor 20 and the second active layer 23. In other embodiments, the distance between the first electrode 24 of the NMOS transistor 20 and the second active layer 23 is greater than the distance between the second electrode 25 of the NMOS transistor 20 and the second active layer 23. The first electrode and the second electrode of the transistor are disposed at different layers, so that films of the inverter circuit may be configured with higher flexibility. For example, a vertical projection of the first electrode on the substrate may overlap a vertical projection of the second electrode on the substrate, thereby reducing the area occupied by the inverter circuit structure.

Figure 15:
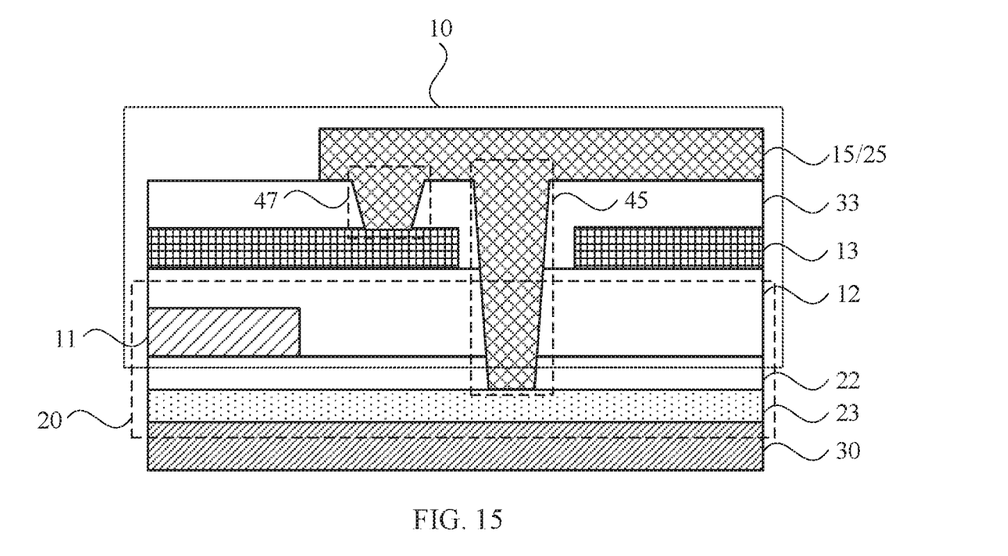
FIG. 15 is another sectional view taken along a line C-C' in FIG. 7.
Figure 16:
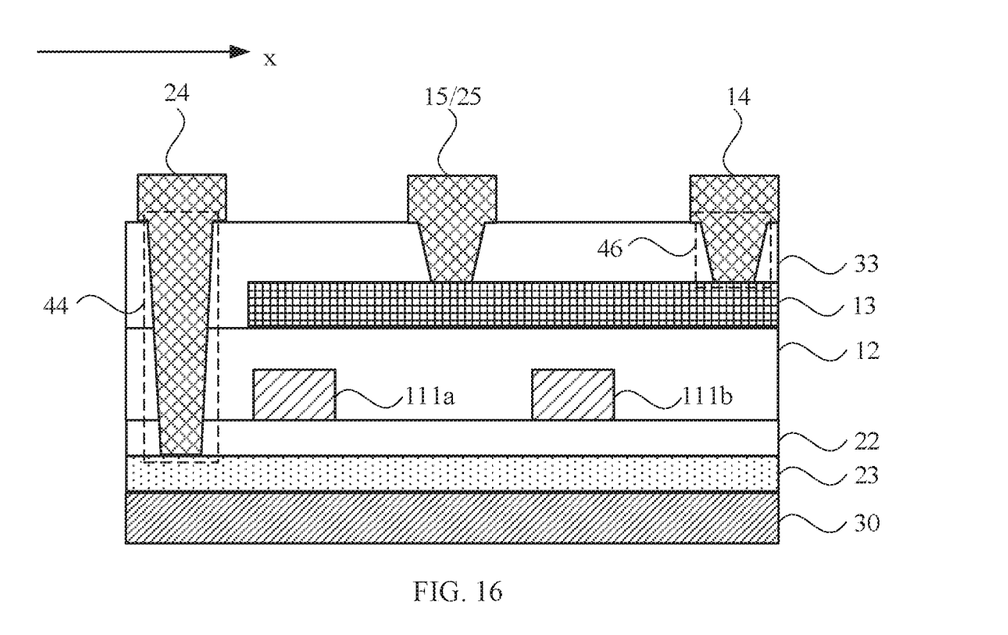
FIG. 16 is another sectional view taken along a line D-D' in FIG. 7.

FIG. 15 is another sectional view taken along the line C-C' in FIG. 7. FIG. 16 is another sectional view taken along the line D-D' in FIG. 7. Referring to FIG. 15 and FIG. 16, in one embodiment of the present disclosure, the inverter circuit structure further includes the substrate 30 and a fourth insulating layer 33, where the second active layer 23 is disposed on the side of the gate layer 11 facing towards the substrate 30. The first electrode 14 of the PMOS transistor 10, the second electrode 15 of the PMOS transistor 10, the first electrode 24 of the NMOS transistor 20 and the second electrode 25 of the NMOS transistor 20 are all disposed on a side of the fourth insulating layer 33 facing away from the first active layer 13. The first electrode 24 of the NMOS transistor 20 is electrically connected to the second active layer 23 through a fifth via 44 penetrating through the fourth insulating layer 33, the first insulating layer 12 and the second insulating layer 22 in sequence, and the second electrode 25 of the NMOS transistor 20 is electrically connected to the second active layer 23 through a sixth via 45 penetrating through the fourth insulating layer 33, the first insulating layer 12 and the second insulating layer 22 in sequence. The first electrode 14 of the PMOS transistor 10 is electrically connected to the first active layer 13 through a seventh via 46 penetrating through the fourth insulating layer 33, and the second electrode 15 of the PMOS transistor 10 is electrically connected to the first active layer 13 through an eighth via 47 penetrating through the fourth insulating layer 33. The first active layer 13 is a patterned structure, and a region where the fifth via 44 is located and a region where the sixth via 45 is located are exposed.

The present embodiment is different from the embodiment shown in FIGS. 12 and 13 in that the PMOS transistor 10 is disposed above the NMOS transistor 20. When the PMOS transistor 10 is disposed above the NMOS transistor 20, a thickness of the first insulating layer 12 and a thickness of the second insulating layer 22 may be increased appropriately to avoid damages to the second active layer 23 due to temperature or the like in the formation of the first active layer 13.

Figure 17:
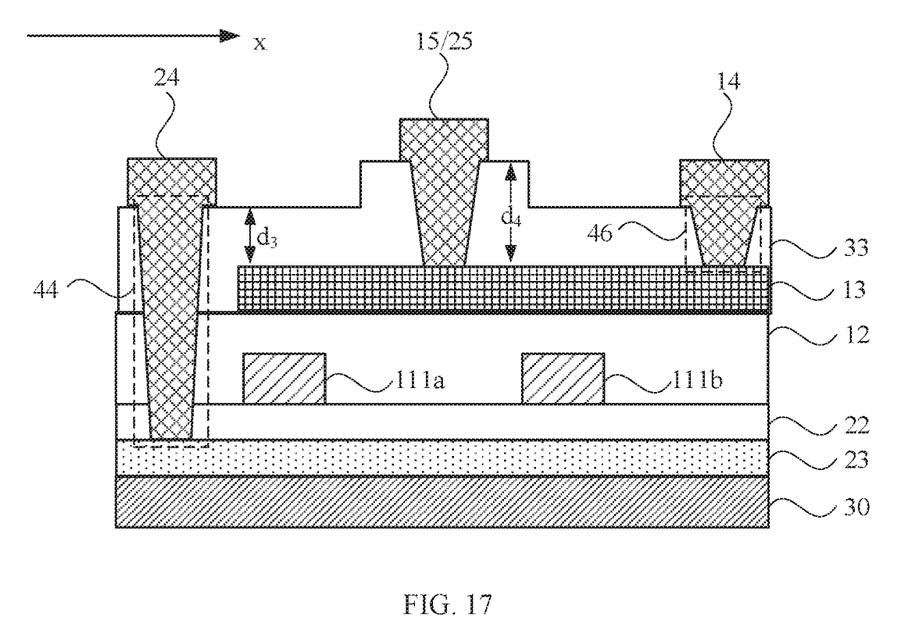
FIG. 17 is another sectional view taken along a line D-D' in FIG. 7.

FIG. 17 is another sectional view taken along the line D-D' in FIG. 7. Referring to FIG. 17, in one embodiment of the present disclosure, the first electrode 14 of the PMOS transistor and the first electrode 24 of the NMOS transistor are arranged at a same layer; the second electrode 15 of the PMOS transistor and the second electrode 25 of the NMOS transistor are arranged at a same layer; and a distance between the first electrode 24 of the NMOS transistor and the first active layer 13 is different from a distance between the second electrode 25 of the NMOS transistor and the first active layer 13.

FIG. 17 exemplarily shows that the distance $d_3$ between the first electrode 24 of the NMOS transistor and the first active layer 13 is smaller than the distance $d_4$ between the second electrode 25 of the NMOS transistor and the first active layer 13. In other embodiments, the distance between the first electrode 24 of the NMOS transistor and the first active layer 13 is greater than the distance between the second electrode 25 of the NMOS transistor and the first active layer 13. The first electrode and the second electrode of the NMOS transistor are disposed at different layers, so that the films of the inverter circuit may be configured with the higher flexibility. For example, the vertical projection of the first electrode on the substrate may overlap the vertical projection of the second electrode on the substrate, thereby reducing the area of the inverter circuit structure.

With continued reference to FIGS. 12 and 13 or FIGS. 15 and 16, in one embodiment of the present disclosure, the first electrode 14 of the PMOS transistor 10, the first electrode 24 of the NMOS transistor 20, the second electrode 15 of the PMOS transistor 10 and the second electrode 25 of the NMOS transistor 20 are arranged at a same layer.

With arranging the first electrode 14 and the second electrode 15 of the PMOS transistor 10 and the first electrode 24 and the second electrode 25 of the NMOS transistor 20 at the same layer, all the electrodes may be simultaneously formed in the same procedure, which helps to simplify the process flow, improve manufacturing efficiency, and reduce costs.

Figure 18:
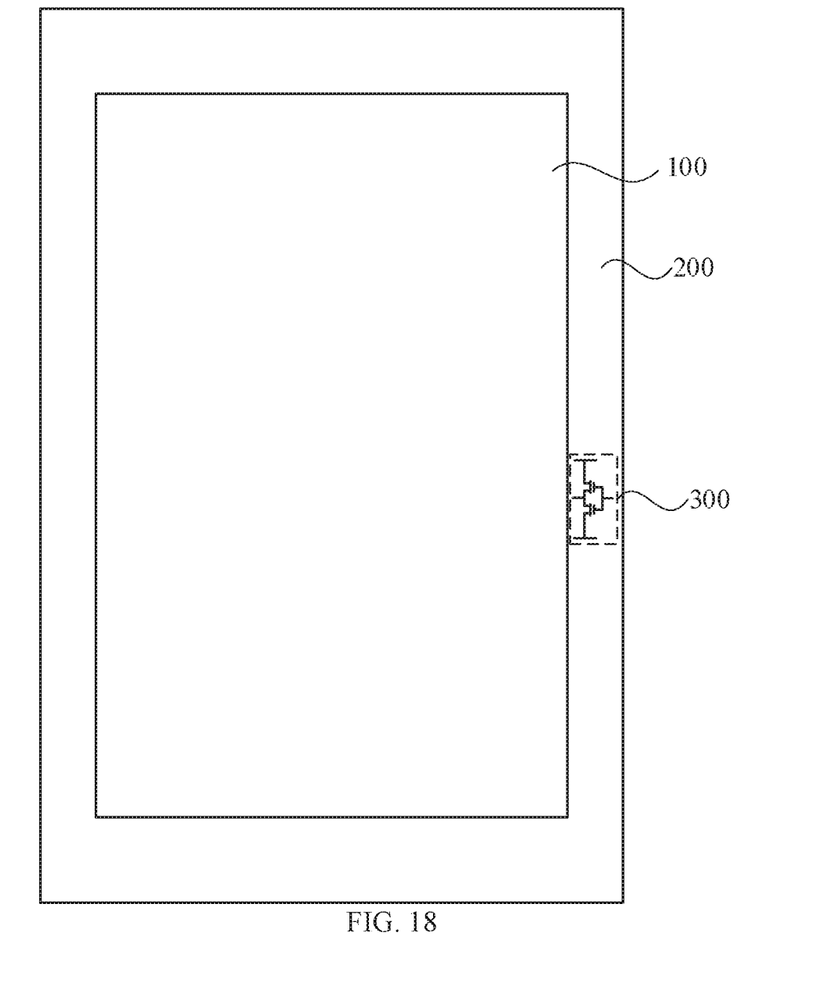
FIG. 18 is a structural diagram of a display panel according to an embodiment of the present disclosure.

An embodiment of the present disclosure further provide a gate driving circuit which includes at least one inverter circuit structure provided by the above-mentioned embodiments. The gate driving circuit provided by the embodiment of the present disclosure may be applied to a display panel, such as a liquid crystal display panel or an organic light-emitting display panel including a thin film transistor. The inverter circuit is electrically connected to a gate of the thin film transistor in the display panel to control the thin film transistor to be turned on or turned off. FIG. 18 is a structural diagram of an exemplary display panel according to an embodiment of the present disclosure. The display panel includes a display region 100 and a frame region 200 surrounding the display region. Since a gate driving circuit 300 is generally disposed in the frame region 200 of the display panel, the inverter circuit structure provided by the embodiment of the present disclosure has a smaller area than the existing planar inverter circuit, thereby effectively reducing a width of the display panel occupied by the gate driving circuit, narrowing the frame of the display panel, and improving a screen-to-body ratio of the display panel.

An embodiment of the present disclosure further provides a display panel which includes the gate driving circuit provided in the embodiment described above. The display panel may be applied to display devices such as a mobile phone, a computer and a smart wearable device.

The above are only exemplary embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An inverter circuit structure, comprising:
   a P-channel transistor and an N-channel transistor, wherein the inverter circuit structure comprises:
   a first active layer, a gate layer, a second active layer, a first insulating layer and a second insulating layer, wherein the first active layer, the gate layer and the second active layer are sequentially stacked, the first insulating layer is between the gate layer and the first active layer, and the second insulating layer is between the gate layer and the second active layer;
   wherein the gate layer comprises a patterned gate, which is electrically connected to a control input terminal;
   wherein a first electrode of the P-channel transistor is electrically connected to a first voltage input terminal, and a second electrode of the P-channel transistor is electrically connected to an output terminal; and a first electrode of the N-channel transistor is electrically connected to a second voltage input terminal, and a second electrode of the N-channel transistor is electrically connected to the output terminal;
   wherein the P-channel transistor comprises the first active layer and the N-channel transistor comprises the second active layer; and
   wherein the patterned gate comprises a first sub-gate and a second sub-gate, an orthographic projection of the first sub-gate on a plane where the first active layer is located is a first region, an orthographic projection of the second sub-gate on the plane where the first active layer is located is a second region, an orthographic projection of the first sub-gate on a plane where the second active layer is located is a third region, an orthographic projection of the second sub-gate on the plane where the second active layer is located is a fourth region, the first active layer extends from the first region to the second region, and the second active layer extends from the third region to the fourth region.

2. The inverter circuit structure of claim 1, wherein the patterned gate comprises at least two strip-shaped sub-gates, wherein the at least two strip-shaped sub-gates are electrically connected to each other through at least one common terminal.

3. The inverter circuit structure of claim 2, wherein in a first direction, the second electrode of the PMOS transistor and the second electrode of the NMOS transistor are disposed between two of the at least two strip-shaped sub-gates, wherein the first direction is perpendicular to an extending direction of the at least two strip-shaped sub-gates.

4. The inverter circuit structure of claim 3, wherein the second electrode of the PMOS transistor is reused as the second electrode of the NMOS transistor, the second electrode of the NMOS transistor is electrically connected to the second active layer, and the second electrode of the NMOS transistor is electrically connected to the first active layer through a via of the second active layer, the second insulating layer and the first insulating layer in sequence.

5. The inverter circuit structure of claim 3, wherein the second electrode of the NMOS transistor is reused as the second electrode of the PMOS transistor, the second electrode of the PMOS transistor is electrically connected to the first active layer, and the second electrode of the PMOS transistor is electrically connected to the second active layer through a via of the first active layer, the first insulating layer and the second insulating layer in sequence.

6. The inverter circuit structure of claim 2, wherein the at least two strip-shaped sub-gates form a ring-shaped pattern.

7. The inverter circuit structure of claim 6, wherein an outer edge of the ring-shaped pattern is quadrilateral.

8. The inverter circuit structure of claim 1, wherein the first active layer comprises a polysilicon active layer, and the second active layer comprises an oxide active layer.

9. The inverter circuit structure of claim 8, further comprising:
a substrate, wherein the first active layer is disposed on a side of the gate layer facing towards the substrate; and
a third insulating layer, wherein the first electrode of the P-channel transistor, the second electrode of the P-channel transistor, the first electrode of the N-channel transistor and the second electrode of the N-channel transistor each are disposed on a side of the third insulating layer facing away from the second active layer;
wherein the first electrode of the P-channel transistor is electrically connected to the first active layer through a first via of the third insulating layer, the second insulating layer and the first insulating layer in sequence, and the second electrode of the P-channel transistor is electrically connected to the first active layer through a second via of the third insulating layer, the second insulating layer and the first insulating layer in sequence;
wherein the first electrode of the N-channel transistor is electrically connected to the second active layer through a third via of the third insulating layer, and the second electrode of the N-channel transistor is electrically connected to the second active layer through a fourth via of the third insulating layer; and
wherein the second active layer is a patterned structure, and a region where the first via is located and a region where the second via is located are exposed.

10. The inverter circuit structure of claim 9, wherein the first electrode of the P-channel transistor and the first electrode of the N-channel transistor are arranged at a same layer, and the second electrode of the P-channel transistor and the second electrode of the N-channel transistor are arranged at a same layer; and
wherein a distance between the first electrode of the N-channel transistor and the second active layer is different from a distance between the second electrode of the N-channel transistor and the second active layer.

11. The inverter circuit structure of claim 9, wherein the first electrode of the P-channel transistor, the first electrode of the N-channel transistor, the second electrode of the P-channel transistor and the second electrode of the N-channel transistor are arranged at a same layer.

12. The inverter circuit structure of claim 8, comprising:
a substrate, wherein the second active layer is disposed on a side of the gate layer facing towards the substrate; and
a fourth insulating layer, wherein the first electrode of the P-channel transistor, the second electrode of the P-channel transistor, the first electrode of the N-channel transistor and the second electrode of the N-channel transistor each are disposed on a side of the fourth insulating layer facing away from the first active layer;
wherein the first electrode of the N-channel transistor is electrically connected to the second active layer through a fifth via of the fourth insulating layer, the first insulating layer and the second insulating layer in sequence, and the second electrode of the N-channel transistor is electrically connected to the second active layer through a sixth via of the fourth insulating layer, the first insulating layer and the second insulating layer in sequence;
wherein the first electrode of the P-channel transistor is electrically connected to the first active layer through a seventh via of the fourth insulating layer, and the second electrode of the P-channel transistor is electrically connected to the first active layer through an eighth via of the fourth insulating layer; and
wherein the first active layer has a pattered structure, and a region where the fifth via is located and a region where the sixth via is located are exposed.

13. The inverter circuit structure of claim 12, wherein the first electrode of the P-channel transistor, the first electrode of the N-channel transistor, the second electrode of the P-channel transistor and the second electrode of the N-channel transistor are arranged at a same layer.

14. The inverter circuit structure of claim 12, wherein the first electrode of the P-channel transistor and the first electrode of the N-channel transistor are arranged at a same layer, and the second electrode of the P-channel transistor and the second electrode of the N-channel transistor are arranged at a same layer; and
wherein a distance between the first electrode of the N-channel transistor and the first active layer is different from a distance between the second electrode of the N-channel transistor and the first active layer.

15. A gate driving circuit, comprising:
at least one inverter circuit structure, wherein each of the at least one inverter circuit structure comprises: a P-channel transistor and an N-channel transistor,
wherein the inverter circuit structure comprises: a first active layer, a gate layer, a second active layer, a first insulating layer and a second insulating layer, wherein the first active layer, the gate layer and the second active layer are sequentially stacked, the first insulating layer is between the gate layer and the first active layer, and the second insulating layer is between the gate layer and the second active layer;
wherein the gate layer comprises a patterned gate, which is electrically connected to a control input terminal;
wherein a first electrode of the P-channel transistor is electrically connected to a first voltage input terminal, and a second electrode of the P-channel transistor is electrically connected to an output terminal; and a first electrode of the N-channel transistor is electrically connected to a second voltage input terminal, and a second electrode of the N-channel transistor is electrically connected to the output terminal;

wherein the P-channel transistor comprises the first active layer and the N-channel transistor comprises the second active layer; and wherein the patterned gate comprises a first sub-gate and a second sub-gate, an orthographic projection of the first sub-gate on a plane where the first active layer is located is a first region, an orthographic projection of the second sub-gate on the plane where the first active layer is located is a second region, an orthographic projection of the first sub-gate on a plane where the second active layer is located is a third region, an orthographic projection of the second sub-gate on the plane where the second active layer is located is a fourth region, the first active layer extends from the first region to the second region, and the second active layer extends from the third region to the fourth region.

16. A display panel, comprising a gate driving circuit, wherein the gate driving circuit comprises at least one inverter circuit structure, wherein each of the at least one inverter circuit structure comprises: a P-channel transistor and an N-channel transistor, wherein the inverter circuit structure comprises: a first active layer, a gate layer, a second active layer, a first insulating layer and a second insulating layer, wherein the first active layer, the gate layer and the second active layer are sequentially stacked, the first insulating layer between the gate layer and the first active layer, and the second insulating layer between the gate layer and the second active layer;

wherein the gate layer comprises a patterned gate, which is electrically connected to a control input terminal;

wherein a first electrode of the P-channel transistor is electrically connected to a first voltage input terminal, and a second electrode of the P-channel transistor is electrically connected to an output terminal; and a first electrode of the N-channel transistor is electrically connected to a second voltage input terminal, and a second electrode of the N-channel transistor is electrically connected to the output terminal;

wherein the P-channel transistor comprises the first active layer and the N-channel transistor comprises the second active layer; and wherein the patterned gate comprises a first sub-gate and a second sub-gate, an orthographic projection of the first sub-gate on a plane where the first active layer is located is a first region, an orthographic projection of the second sub-gate on the plane where the first active layer is located is a second region, an orthographic projection of the first sub-gate on a plane where the second active layer is located is a third region, an orthographic projection of the second sub-gate on the plane where the second active layer is located is a fourth region, the first active layer extends from the first region to the second region, and the second active layer extends from the third region to the fourth region.

* * * * *